(12) United States Patent
Lin

(10) Patent No.: US 11,009,551 B2
(45) Date of Patent: May 18, 2021

(54) DEVICE AND METHOD OF ANALYZING TRANSISTOR AND NON-TRANSITORY COMPUTER READABLE MEDIUM

(71) Applicant: NANYA TECHNOLOGY CORPORATION, New Taipei (TW)

(72) Inventor: Shih-Ting Lin, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 386 days.

(21) Appl. No.: 16/018,036

(22) Filed: Jun. 25, 2018

(65) Prior Publication Data
US 2019/0391206 A1  Dec. 26, 2019

(51) Int. Cl.
G01R 31/317 (2006.01)
G06F 30/367 (2020.01)

(52) U.S. Cl.
CPC ..... G01R 31/31725 (2013.01); G06F 30/367 (2020.01)

(58) Field of Classification Search
CPC ................... G01R 31/31725; G06F 30/367
USPC .......................................................... 702/66
See application file for complete search history.

(56) References Cited

U.S. PATENT DOCUMENTS

| 7,552,040 | B2 | 6/2009 | Dorfman et al. | |
| 2002/0053924 | A1* | 5/2002 | Sakata | G11C 5/147 326/34 |
| 2015/0143326 | A1* | 5/2015 | Alpert | G06F 30/367 716/136 |
| 2015/0168468 | A1* | 6/2015 | Peng | G01R 27/08 324/713 |

FOREIGN PATENT DOCUMENTS

| TW | I240417 B | 9/2005 |
| TW | I278764 B | 4/2007 |
| TW | 201020839 A | 6/2010 |
| TW | 201725723 A | 7/2017 |

OTHER PUBLICATIONS

John Kenney, An Enhanced Slew Rate Source Follower (Year: 1995).*

* cited by examiner

Primary Examiner — Michael P Nghiem
Assistant Examiner — Dacthang P Ngo
(74) Attorney, Agent, or Firm — CKC & Partners Co., LLC

(57) ABSTRACT

A device of analyzing at least one transistor includes a tester circuit, a measure device and a processor. The tester circuit is electrically connected to the transistor, the measure device is electrically connected to the transistor, and the processor is electrically connected to the measure device. The tester circuit is configured to test the transistor. The measure device is configured to receive a waveform from the transistor. The processor is configured to perform a curve-fitting on the waveform to get a transistor characteristic curve, to model the transistor characteristic curve to generate a transistor model, to simulate and regulate one or more parameters of the transistor model to create a new transistor model, and to extract slew rate data from the new transistor model.

8 Claims, 3 Drawing Sheets

DEVICE AND METHOD OF ANALYZING TRANSISTOR AND NON-TRANSITORY COMPUTER READABLE MEDIUM

BACKGROUND

Field of Invention

The present invention relates to devices and methods of analyzing transistors.

Description of Related Art

Dynamic random-access memory (DRAM) is a type of random access semiconductor memory that stores each bit of data in a separate tiny capacitor within an integrated circuit. DRAM is widely used in digital electronics.

In the design of the DRAM circuit, the array transistor is not only responsible for reading and writing of the cell, but also influences the speed switch of the sense amplifier, and affects the time of subsequent signal amplification, including the pull-up slope of the slew rate (SR). When the slew rate of the array transistor is not pulled fast enough, the performance of circuits will be slowed down.

SUMMARY

An embodiment of the present disclosure is related to a device of analyzing at least one transistor. The device includes a tester circuit, a measure device and a processor. The tester circuit is electrically connected to the transistor, the measure device is electrically connected to the transistor, and the processor is electrically connected to the measure device. The tester circuit is configured to test the transistor. The measure device is configured to receive a waveform from the transistor. The processor is configured to perform a curve-fitting on the waveform to get a transistor characteristic curve, to model the transistor characteristic curve to generate a transistor model, to simulate and regulate one or more parameters of the transistor model to create a new transistor model, and to extract slew rate data from the new transistor model.

Another embodiment of the present disclosure is related to a method of analyzing at least one transistor. The method includes steps of: testing the transistor to receive a waveform from the transistor; performing a curve-fitting on the waveform to get a transistor characteristic curve; modeling the transistor characteristic curve to generate a transistor model; simulating and regulating one or more parameters of the transistor model to create a new transistor model; and extracting slew rate data from the new transistor model.

Yet another embodiment of the present disclosure is related to a non-transitory computer readable medium to store a plurality of instructions for commanding a computer to execute a method of analyzing at least one transistor. The method includes steps of: testing the transistor to receive a waveform from the transistor; performing a curve-fitting on the waveform to get a transistor characteristic curve; modeling the transistor characteristic curve to generate a transistor model; simulating and regulating one or more parameters of the transistor model to create a new transistor model; and extracting slew rate data from the new transistor model.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
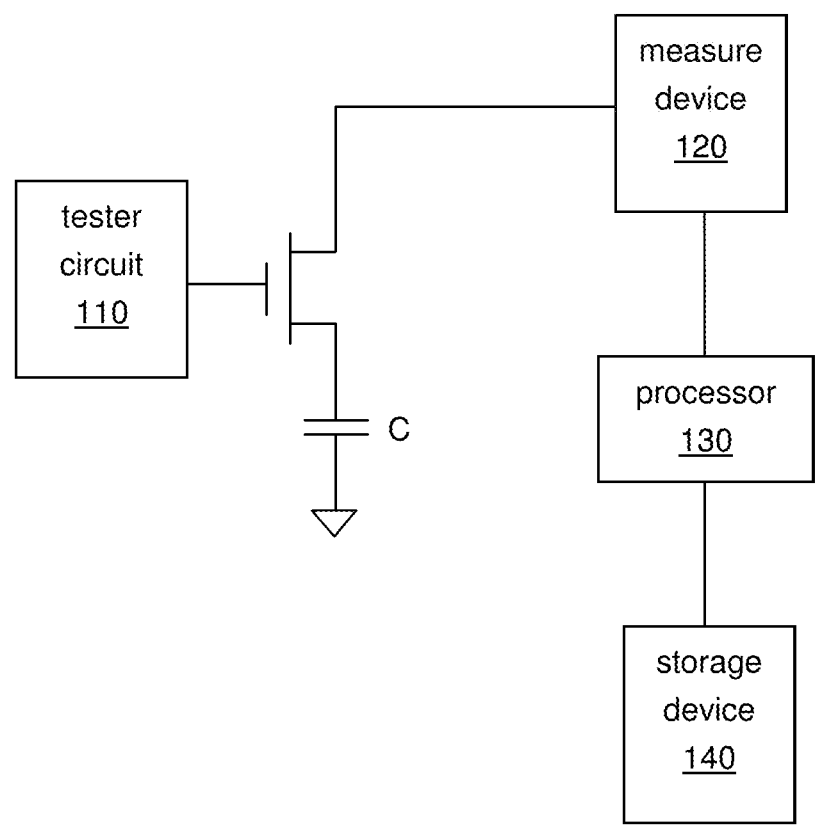
FIG. 1 is a block diagram of a device according to some embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

As used in the description herein and throughout the claims that follow, the meaning of "a", "an", and "the" includes reference to the plural unless the context clearly dictates otherwise. Also, as used in the description herein and throughout the claims that follow, the terms "comprise or comprising", "include or including", "have or having", "contain or containing" and the like are to be understood to be open-ended, i.e., to mean including but not limited to. As used in the description herein and throughout the claims that follow, the meaning of "in" includes "in" and "on" unless the context clearly dictates otherwise.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram of a device 100 according to some embodiments of the present disclosure. As shown in FIG. 1, the device 100 includes a tester circuit 110, a measure device 120, a processor 130 and a storage device 140. For example, the measure device 120 may be a waveform detector or the like, the processor 130 may be a central processing unit (CPU), and the storage device 140 may be a hard disk drive (HDD) or a solid-state drive (SSD).

In structure, the tester circuit 110 is electrically connected to at least one transistor 190, the measure device 120 is electrically connected to the transistor 190, the processor 130 is electrically connected to the measure device 120, and the storage device 140 is electrically connected to the processor 130.

For example, the tester circuit 110 is directly connected to a gate of the transistor 190, a drain of the transistor 190 is directly connected to the measure device 120, and a source of the transistor 190 is directly connected to the ground through a capacitor C. The transistor 190 may be one or more transistors of array in DRAM circuit, but the present disclosure is not limited thereto.

In use, the tester circuit 110 is configured to test the transistor 190, and the measure device 120 is configured to receive a waveform from the transistor 190. In some embodiments, the tester circuit 110 sends one or more test signals to the transistor 190, so that the transistor 190 can output one or more waveforms.

The processor 130 is configured to perform a curve-fitting on the waveform to get a transistor characteristic curve. Next, the processor 130 is configured to model the transistor characteristic curve to generate a transistor model, in which the transistor model includes parameters (e.g., parameters related to threshold voltage) corresponding to the transistor 190. Then, the processor 130 is configured to simulate and regulate one or more of parameters of the transistor model to create a new transistor model, in which the new transistor model includes regulated parameters of the simulated transistor. Then, the processor 130 is configured to extract slew rate data from the new transistor model.

Moreover, the storage device 140 is configured to store the slew rate data associated with the one or more regulated parameters as a basis of manufacturing a new transistor. Therefore, the semiconductor device manufacturing apparatus can be electrically connected to the storage device 140 and be configured to manufacture the new transistor based on the regulated parameters.

In some embodiments, the regulated parameters includes at least one of a drain current (IDS), a constant current threshold voltage (VTCC), a standard threshold voltage (SVT), and/or a subthreshold swing (SW).

Figure 2:
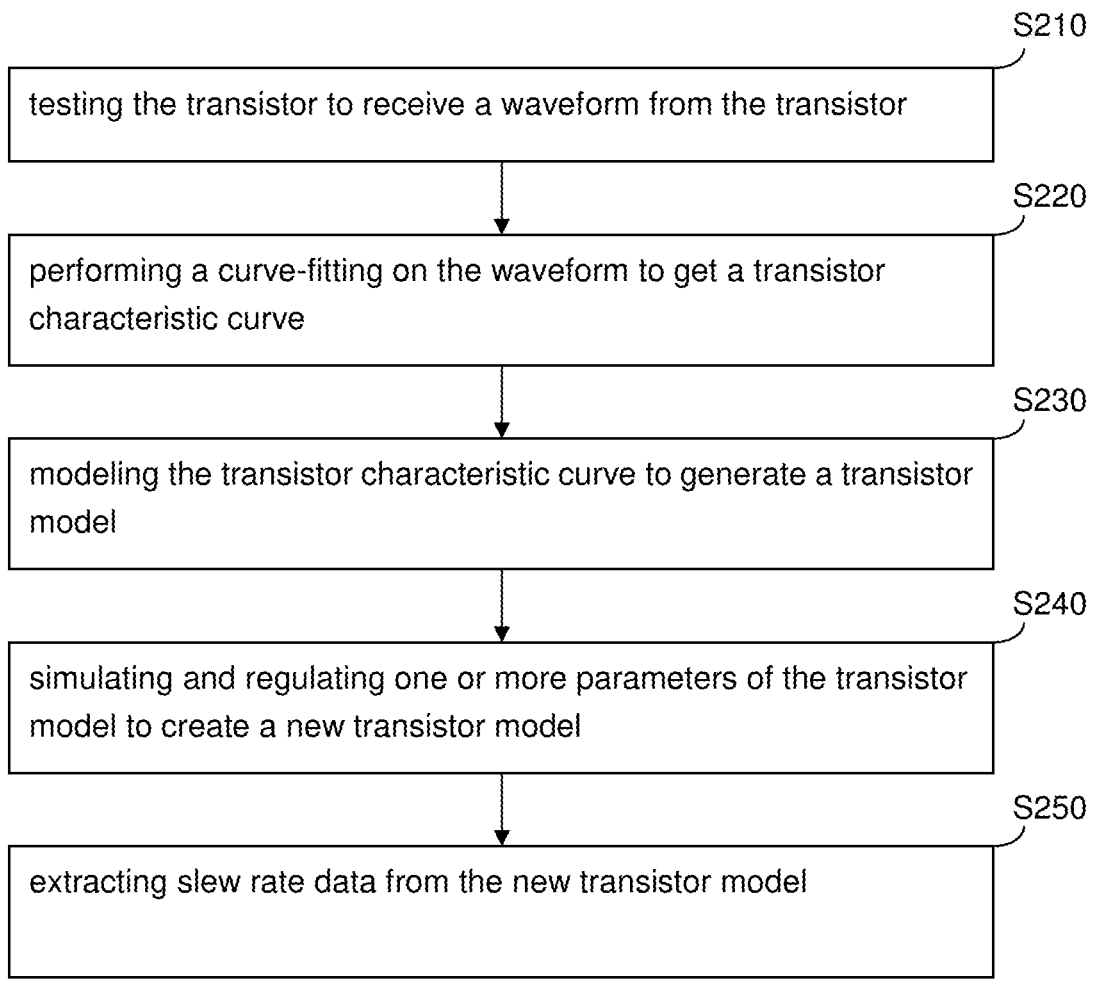
FIG. 2 is a flow chart of a method according to some embodiments of the present disclosure.

For a more complete understanding of a method performed by the device 100, referring FIGS. 1-2, FIG. 2 is a flow chart of the method 200 according to an embodiment of the present disclosure. As shown in FIG. 2, the voltage switching method 200 includes operations S210, S220, S230, S240 and S250. However, as could be appreciated by persons having ordinary skill in the art, for the steps described in the present embodiment, the sequence in which these steps is performed, unless explicitly stated otherwise, can be altered depending on actual needs; in certain cases, all or some of these steps can be performed concurrently.

The method 200 may take the form of a computer program product on a computer-readable storage medium having computer-readable instructions embodied in the medium. Any suitable storage medium may be used including non-volatile memory such as read only memory (ROM), programmable read only memory (PROM), erasable programmable read only memory (EPROM), and electrically erasable programmable read only memory (EEPROM) devices; volatile memory such as SRAM, DRAM, and DDR-RAM; optical storage devices such as CD-ROMs and DVD-ROMs; and magnetic storage devices such as hard disk drives and floppy disk drives.

In operation S210, the transistor 190 is tested to receive a waveform from the transistor 190. In operation S220, a curve-fitting is performed on the waveform to get a transistor characteristic curve. In operation S230, the transistor characteristic curve is modeled to generate a transistor model, in which the transistor model includes parameters (e.g., parameters related to threshold voltage) corresponding to the transistor 190. In operation S240, one or more parameters of the transistor model are simulated and regulated to create a new transistor model, in which the new transistor model includes regulated parameters of the simulated transistor. In operation S250, slew rate data are extracted from the new transistor model.

In method 200, the slew rate data associated with the one or more regulated parameters are stored as a basis of manufacturing a new transistor. Therefore, the semiconductor device manufacturing apparatus can be configured to manufacture the new transistor based on the regulated parameters.

In some embodiments, the regulated parameters includes at least one of the drain current (IDS), the constant current threshold voltage (VTCC), the standard threshold voltage (SVT), and/or the subthreshold swing (SW). In operation S240, the drain current (IDS) is increased, the constant current threshold voltage (VTCC) is decreased, the standard threshold voltage (SVT) is decreased, and/or the subthreshold swing (SW) is decreased. In this way, the slew rate can be improved.

Figure 3:
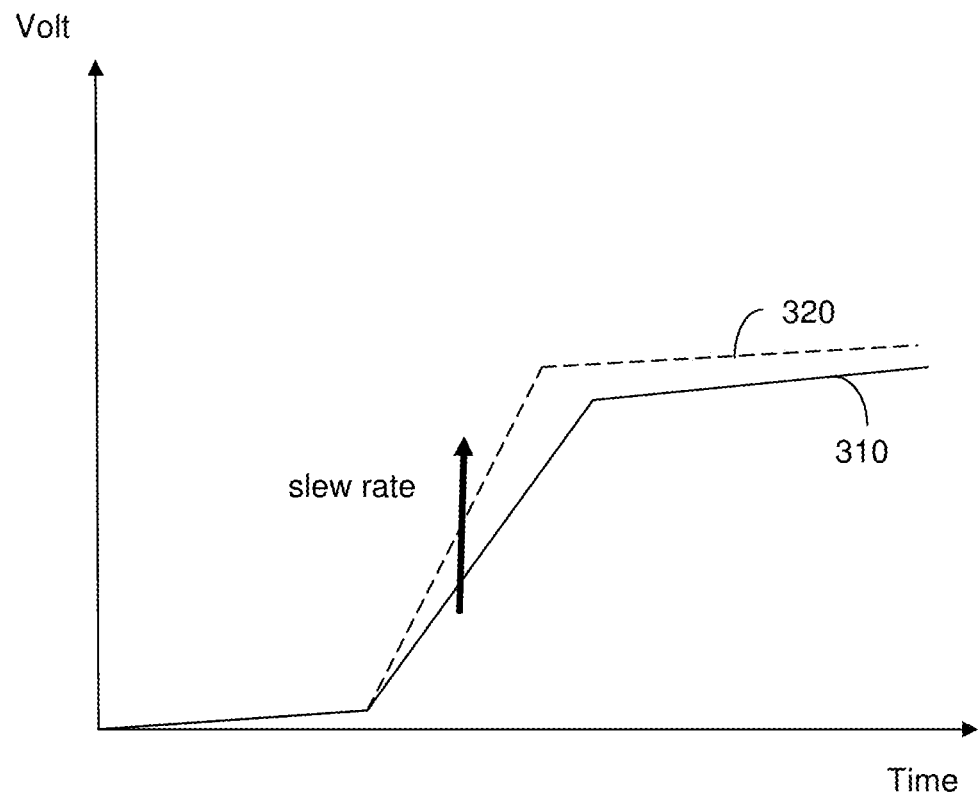
FIG. 3 shows a slew rate according to some embodiments of the present disclosure.

In practice, the drain current (IDS) can be increased about 10%, the constant current threshold voltage (VTCC) can be decreased about 100 mV, the standard threshold voltage (SVT) can be decreased about 20%, and/or the subthreshold swing (SW) can be decreased about 20%. In this way, the slew rate can be improved about 30-50 times For a more complete understanding of slew rate, referring FIGS. 1-3, FIG. 3 shows the slew rate according to some embodiments of the present disclosure. Specifically, FIG. 3 shows the original transistor characteristic curve 310 of the transistor 190 and a new transistor characteristic curve 310 of the new transistor model. Compared with the original transistor characteristic curve 310, the new transistor characteristic curve 310 has an improved slew rate.

In view of the above, the device 100 and the method 200 can improve the slew rate (SR) efficiency and the circuit performance by using a novel model regulation methodology.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A device of analyzing at least one transistor, comprising:
   a tester circuit electrically connected to the transistor and configured to test the transistor;
   a measure device electrically connected to the transistor and configured to receive a waveform from the transistor, wherein the tester circuit is directly connected to a gate of the transistor, a drain of the transistor is directly connected to the measure device, a source of the transistor is directly connected to the ground through a capacitor, and the transistor is arrayed in a dynamic random-access memory (DRAM) circuit; and
   a processor electrically connected to the measure device and configured to perform a curve-fitting on the waveform to get a transistor characteristic curve, to model the transistor characteristic curve to generate a transistor model, to simulate and regulate one or more parameters of the transistor model to create a new transistor model, and to extract slew rate data from the new transistor model, wherein the transistor model comprises the one or more parameters corresponding to the transistor, the one or more parameters comprise a drain current, a constant current threshold voltage, a standard threshold voltage and a subthreshold swing, the processor creates the new transistor model by increasing the drain current, decreasing the constant current threshold voltage, decreasing the standard threshold voltage, and decreasing the subthreshold swing.

2. The device of claim 1, further comprising:
a storage device electrically connected to the processor and configured to store the slew rate data associated with the one or more parameters as a basis of manufacturing a new transistor.

3. The device of claim 1, wherein the tester circuit send a test signal to the transistor, so that the transistor outputs the waveform.

4. A method of analyzing at least one transistor, comprising steps of:
testing the transistor through a tester circuit, so that a measure device receives a waveform from the transistor, wherein the tester circuit is directly connected to a gate of the transistor, a drain of the transistor is directly connected to the measure device, a source of the transistor is directly connected to the ground through a capacitor, and the transistor is arrayed in a DRAM circuit;
performing a curve-fitting on the waveform to get a transistor characteristic curve;
modeling the transistor characteristic curve to generate a transistor model, wherein the transistor model comprises one or more parameters corresponding to the transistor;
simulating and regulating the one or more parameters of the transistor model to create a new transistor model, wherein the one or more parameters comprise a drain current, a constant current threshold voltage, a standard threshold voltage and a subthreshold swing, the step of regulating the one or more parameters of the transistor model to create a new transistor model comprise creating the new transistor model by increasing the drain current, decreasing the constant current threshold voltage, decreasing the standard threshold voltage, and decreasing the subthreshold swing; and
extracting slew rate data from the new transistor model.

5. The method of claim 4, further comprising:
storing the slew rate data associated with the one or more parameters as a basis of manufacturing a new transistor.

6. The method of claim 4, wherein the step of testing the transistor comprises sending a test signal to the transistor, so that the transistor outputs the waveform.

7. A non-transitory computer readable medium to store a plurality of instructions for commanding a computer to execute a method of analyzing at least one transistor, the method comprising steps of:
testing the transistor through a tester circuit, so that a measure device receives a waveform from the transistor, wherein the tester circuit is directly connected to a gate of the transistor, a drain of the transistor is directly connected to the measure device, a source of the transistor is directly connected to the ground through a capacitor, and the transistor is arrayed in a DRAM circuit;
performing a curve-fitting on the waveform to get a transistor characteristic curve;
modeling the transistor characteristic curve to generate a transistor model, wherein the transistor model comprises one or more parameters corresponding to the transistor;
simulating and regulating the one or more parameters of the transistor model to create a new transistor model, wherein the one or more parameters comprise a drain current, a constant current threshold voltage, a standard threshold voltage and a subthreshold swing, the step of regulating the one or more parameters of the transistor model to create the new transistor model comprise creating the new transistor model by increasing the drain current, decreasing the constant current threshold voltage, decreasing the standard threshold voltage, and decreasing the subthreshold swing; and
extracting slew rate data from the new transistor model.

8. The non-transitory computer readable medium of claim 7, wherein the method further comprises:
storing the slew rate data associated with the one or more parameters as a basis of manufacturing a new transistor.

* * * * *